(12) United States Patent
Driscoll

(10) Patent No.: US 7,475,318 B2
(45) Date of Patent: Jan. 6, 2009

(54) METHOD FOR TESTING THE SENSITIVE INPUT RANGE OF BYZANTINE FILTERS

(75) Inventor: Kevin R. Driscoll, Maple Grove, MN (US)

(73) Assignee: Honeywell International Inc., Morristown, NJ (US)

( * ) Notice: Subject to any disclaimer, the term of this patent is extended or adjusted under 35 U.S.C. 154(b) by 127 days.

(21) Appl. No.: 11/341,810

(22) Filed: Jan. 27, 2006

(65) Prior Publication Data

US 2006/0170445 A1    Aug. 3, 2006

Related U.S. Application Data

(60) Provisional application No. 60/648,070, filed on Jan. 28, 2005.

(51) Int. Cl.
*G01R 31/28*    (2006.01)
(52) U.S. Cl. .................................................. 714/742
(58) Field of Classification Search ................. 714/742; 324/765
See application file for complete search history.

(56) References Cited

U.S. PATENT DOCUMENTS

| 4,961,053 | A |   | 10/1990 | Krug |  |
|---|---|---|---|---|---|
| 5,367,263 | A |   | 11/1994 | Ueda et al. |  |
| 5,991,909 | A | * | 11/1999 | Rajski et al. | 714/729 |
| 6,549,081 | B1 | * | 4/2003 | Le et al. | 331/57 |
| 6,734,743 | B2 | * | 5/2004 | Korson et al. | 331/44 |
| 6,909,301 | B2 | * | 6/2005 | Korson et al. | 324/763 |
| 7,010,735 | B2 | * | 3/2006 | Motika et al. | 714/726 |
| 2002/0095641 | A1 |   | 7/2002 | Cartagena |  |

FOREIGN PATENT DOCUMENTS

WO    03046590    6/2003

OTHER PUBLICATIONS

Nanya et al., "The Byzantine Hardware Fault Model", "IEEE Transactions on Computer Aided Design of Integrated Circuits and Systems", Nov. 1, 1989, pp. 1226-1231, vol. 8, No. 11, Publisher: IEEE, Published in: New York, NY, XP000126894, Document in U.S. Appl. No. 10/993,398.
Driscoll et al., "The Real Byzantine Generals", "Proceedings of Digital Avionics System Conference", Oct. 2004, pp. 6.D.4-1 - 6.D.4-11, Publisher: IEEE.
International Searching Authority, "International Search Report", Sep. 7, 2006, Published in: WO.

* cited by examiner

*Primary Examiner*—James C Kerveros
(74) *Attorney, Agent, or Firm*—Fogg & Powers LLC

(57)  ABSTRACT

A Byzantine filter tester including a feedback loop, a pseudo random waveform generator and an output tester. The feedback loop is coupled between an output of a device under test and an input of the device under test. The feedback loop includes an odd number of inversions that create oscillations and an integrator with a very large time constant for filtering the oscillations to determine an input threshold of the device under test. The pseudo random waveform generator provides waveforms to the input of the device under test to cover test points in a logic grid defined in part by the determined input threshold of the device under test. Finally, the output tester monitors a plurality of redundant outputs of the device under test to verify the proof coverage of the device under test.

17 Claims, 11 Drawing Sheets

METHOD FOR TESTING THE SENSITIVE INPUT RANGE OF BYZANTINE FILTERS

CROSS REFERENCE TO RELATED APPLICATIONS

This application claims priority to U.S. provisional patent application No. 60/648,070, filed on Jan. 28, 2005. Moreover, this application is related to U.S. patent application Ser. No. 10/993,398, filed on Nov. 19, 2004 which claims priority to U.S. provisional patent application No. 60/523,784, filed on Nov. 19, 2003, all of which are incorporated herein by reference.

BACKGROUND

Fault tolerant systems must provide a specified level of service after a fault has occurred. High criticality systems require that faults be tolerated that have a probability of occurrence between $10^{-9}$ to $10^{-6}$ for a one hour exposure. Typically the desired level of fault tolerances must be proven to be met by a combination of analysis and testing. The ability to detect and mitigate a fault is called coverage. The overall system failure probability includes the combination of component fault probability and coverage percentage. For electronic components (typically integrated circuits) used in the environment where highly dependable electronic systems are acquired, one assumes a component failure probability of $10^{-6}$ for a one hour exposure. Moreover, with multiple components in a system, one can assume an overall failure rate in the range of $10^{-4}$ to $10^{-5}$ for a one hour exposure.

Byzantine faults comprise a class of faults that are particularly difficult cover. A Byzantine fault is a fault that presents different outputs to multiple observers. For example, in a logic circuit having an input and multiple redundant outputs, if different observers of the outputs observe different outputs in response to an input, a Byzantine fault is present. Even if the logic circuit has only a single output with multiple observers, each observer can view the output signal differently due to the behavior of a Byzantine fault. Byzantine faults occur in two dimensions, amplitude and time. Regarding amplitude, a Byzantine fault can cause signals traveling through elements in the logic circuit to not be clearly defined as a "logic 1" or a "logic 0." These signals fall somewhere in between the signal level defined as logic 1 and logic 0. These so called "½ logic signals" or "indeterminate logic signals" can be interpreted by different elements in the logic circuits as either a logic 1 or a logic 0. However, not every element in the logic circuit will make the same determination. This is due to manufacturing variances in the logic devices or to such environmental factors as voltage variances and temperature variances. In the time dimension, Byzantine faults can occur in the micro and macro scale. In the micro scale, the faults occur at the bit level wherein the bits are formed too narrow or too wide. At the macro scale, Byzantine faults typically occur due to missing communication signal deadlines. Moreover, Byzantine faults occur more often in the time domain than in the amplitude domain.

For highly critical applications that require system failure probabilities in the neighborhood of $10^{-9}$ for a one hour exposure, methods have to be developed to handle the ½ logic signals. One method of dealing with Byzantine faults is with a filtering device that reshapes ½ logic signals to valid logic signals before the logic signal is observed by the observers. Once the Byzantine faults have been dealt within a filter circuit design, proof of the design's fault coverage is required. Commonly assigned patent application Ser. No. 10/993,398, filed on Nov. 19, 2004 provided a method to prove a design's fault coverage. Reducing the voltage range that needs to be tested would improve the efficiency in providing design fault coverage.

For the reasons stated above and for other reasons stated below which will become apparent to those skilled in the art upon observing and understanding the present specification, there is a need in the art for a method of improving the efficiency of proving a design's fault coverage.

SUMMARY

The above-mentioned problems and other problems are resolved by the present invention and will be understood by observing and studying the following specification.

In one embodiment, a method of determining a device threshold voltage is provided. The method includes connecting a loop with an odd number of inversions between at least one output of the device and at least one input of the device to create oscillations and then filtering out the oscillations.

In yet another embodiment, a method of providing proof coverage of a Byzantine fault tolerance logic circuit is provided. The method includes determining the threshold voltage of a device under test. Defining a logic test grid of test sample points based at least in part on the threshold voltage of the device under test. Generating pseudo random test waveforms adapted to cover the test sample points and observing the output of the device under test.

In still another embodiment, a device input threshold tester is provided. The tester includes a feedback loop and an integrator. The feedback loop is coupled between an output of a device under test and at least one input of the device under test, the feedback loop is adapted to have an odd number of inversions that create an oscillation. The integrator has a very large time constant and is adapted to filter out the oscillations.

In still further another embodiment, a Byzantine filter tester is provided. The tester includes a feedback loop, a pseudo random waveform generator and an output tester. The feedback loop is coupled between an output of a device under test and an input of the device under test. The feedback loop is further adapted to have an odd number of inversions that create oscillations. Moreover, the feedback loop includes an integrator with a very large time constant to filter the oscillations to determine an input threshold of the device under test. The pseudo random waveform generator is adapted to couple waveforms to the input of the device under test that are adapted to cover test points in a logic grid defined in part by the determined input threshold of the device under test. Finally, the output tester is adapted to observe a plurality of redundant outputs of the device under test to verify the proof coverage of the device under test.

In still further another embodiment a proof coverage tester is provided. The proof coverage tester includes a means to determine the input threshold of a device under test, a means to create a logic grid of test points based at least in part on the threshold of the device under test, a means to provide pseudo random test waveforms to an input of the device under test that are adapted to cover the test points in the logic grid and a means to monitor an output of the device under test in response to the pseudo random test waveforms.

BRIEF DESCRIPTION OF THE DRAWINGS

The present invention can be more easily understood and further advantages and uses thereof more readily apparent, when considered in view of the description of the preferred embodiments and the following figures in which.

In accordance with common practice, the various described features are not drawn to scale but are drawn to emphasize specific features relevant to the present invention. Reference characters denote like elements throughout Figures and text.

DETAILED DESCRIPTION

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims and equivalents thereof.

Embodiments of the present invention provide a method of finding a devices switching threshold. That is, embodiments of the present invention determine the voltage level that a device switches from one state to another. Once the devices switching threshold is determined, the voltage range needed to be tested in determining proof of fault coverage can be reduced. Hence the total number of tests that need to be performed is reduced providing a more efficient method of providing proof of the designs fault coverage. Before further description of embodiments of the present invention is provided in detail, background is given to aid in the understanding of and to provide support for the present invention. In particular, FIG. 1A through FIG. 6 provide information regarding logic levels, transition areas and a method and apparatus for providing proof of coverage of a device as claimed in commonly assigned patent application Ser. No. 10/993,398, filed on Nov. 19, 2004.

Figure 1A:
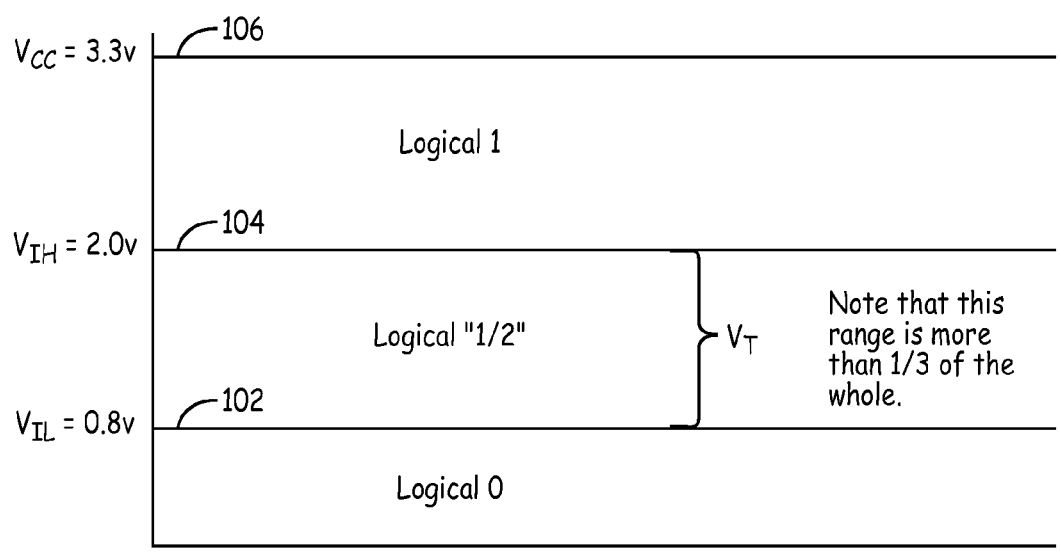
FIG. 1A is an example of a logic voltage level graph for logic devices in a logic circuit.

Referring to FIG. 1A, a logic voltage level graph 100 is illustrated. FIG. 1 is representative of a common logic family in use today and is illustrative of any logic family. Logic level graph 100 shows examples of voltages levels that make up a logic 0, a logic ½ and a logic 1 in logic devices of a circuit. The voltage input low ($V_{IL}$) 102 is the threshold voltage level below which all logic chips in a circuit will observe a logic 0. $V_{IL}$ 102 in this example is 0.8 v. Voltage input high ($V_{IH}$) 104 is the threshold voltage level above which all logic chips in a circuit will observe a logic 1. $V_{IH}$ 104 in this example is 2.0 v.

Also illustrated in FIG. 1A is $V_{CC}$ 106. $V_{CC}$ is the voltage supply level which is 3.3 v in this example.

Figure 1B:
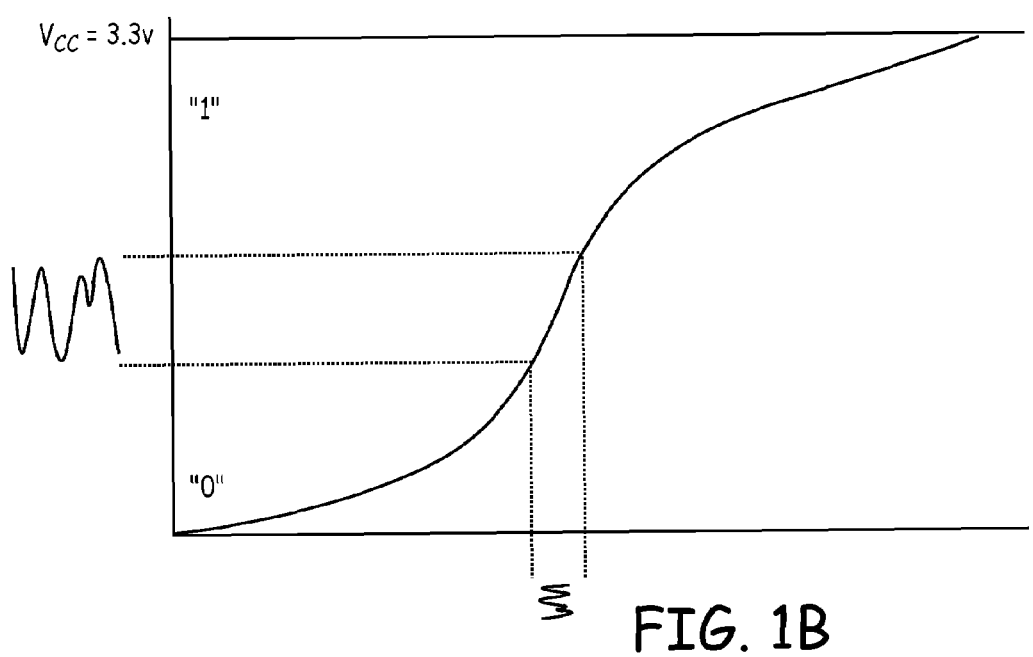
FIG. 1B is a logic gate transfer function graph illustrating the gain of a logic device in the ½ logic area.

As indicated in FIG. 1A, the area between $V_{IL}$ 102 and $V_{IH}$ 104 is the logical ½ region or area. This can also be referred to as the indeterminate region or area. This is the area where it cannot be determined for certain whether a logic circuit will observe the signal as a logic 1 or a logic 0. As indicated, in this example, the indeterminate region makes up more than ⅓ of the voltage range. Therefore, there is relatively wide range of indeterminate logic possibilities that have to be considered in determining proof of fault coverage. The present invention provides a method of testing how logic circuits will behave with signals in the indeterminate logic range. Referring to FIG. 1B, an illustration of a logic gate transfer function is provided. FIG. 1B is provided to show that in the indeterminate logic range, the gain of a logic device is relatively high. Therefore even a little input noise tends to cause relatively large output noise. As a result, instead of looking at DC levels, high frequency and large amplitude noise is typically observed. However, this is still considered to be within the indeterminate logic range because of the integrating effects of electronic circuits at those speeds.

Figure 2:
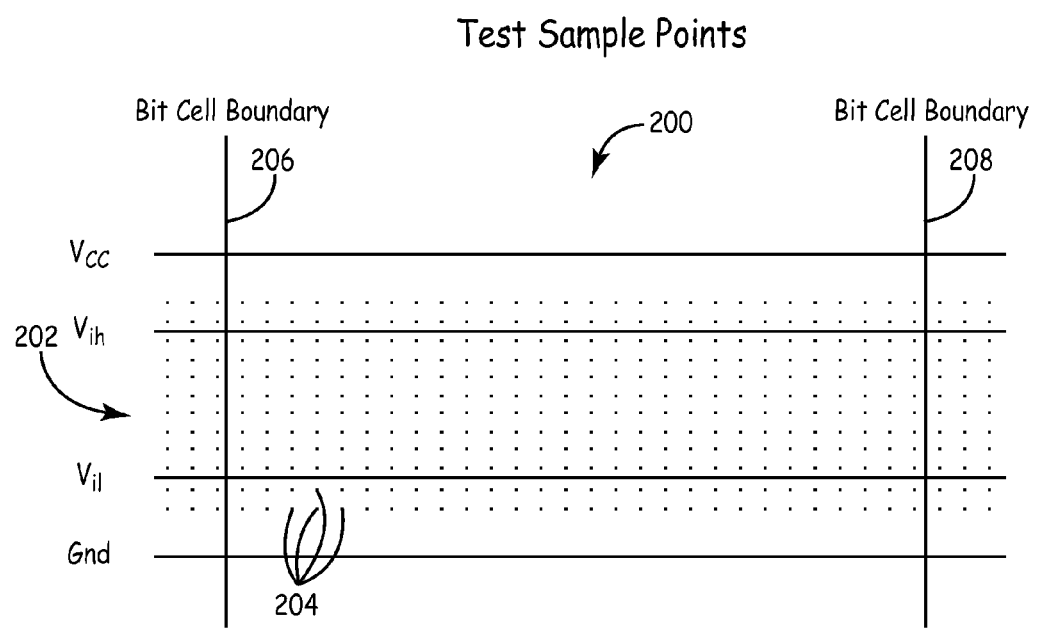
FIG. 2 is a logic voltage level graph with a grid of test sample points.

Embodiments of the present invention use a grid of test sample points in testing proof of coverage of a circuit. FIG. 2 illustrates a logic voltage level graph 200 with a logic level test grid 202. Grid 202 is made up of a plurality of test sample points 204 (or test points 204). The test sample points 204 in the horizontal (row) direction represent a time domain. The density of the test sample points 204 in the time domain direction is limited by the physics of a device under test (DUT). In particular, the distance between adjacent test sample points 204 in the horizontal direction is related to the maximum frequency a device can handle. For example, if the DUT can only handle a signal as fast as 250 pico seconds, the minimum distance between two adjacent test sample points in the horizontal direction will represent 250 pico seconds.

Each test sample point 204 in the vertical (column) direction represents a voltage level of a signal or waveform that is tested during a proof of fault coverage test. The density of the test sample points 202 in the vertical direction are determined by the desired thoroughness of the test and the linear and non-linear properties of the devices (or device) in the DUT. For example, devices that exhibit linear properties, like CMOS, allow for greater vertical distance between adjacent test sample points 204. In linear devices, it is understood that once the behavior of these devices is determined at two end points, the behavior in between the two end points is also known due to their linearly nature. With linear devices, consistency in the grid is a significant attribute in designing an effective grid. In regards to non-linear devices, their needs to be sufficient test sample points 204 in the vertical direction to cover all non-linearity's that are the result of inflections in the transfer functions of the non-linear device. For example, a simple gate not only performs its designed logic, it also acts as an amplifier. The voltage in and voltage out follows some kind of transfer curve. If the transfer curve is non-linear, the test sample points are placed at every high and low point. FIG. 2 also illustrates cell boundaries 206 and 208. The cell boundaries 206 and 208 indicate the period of time between one data transition to another data transition which is determined by a clock frequency.

Figure 3:
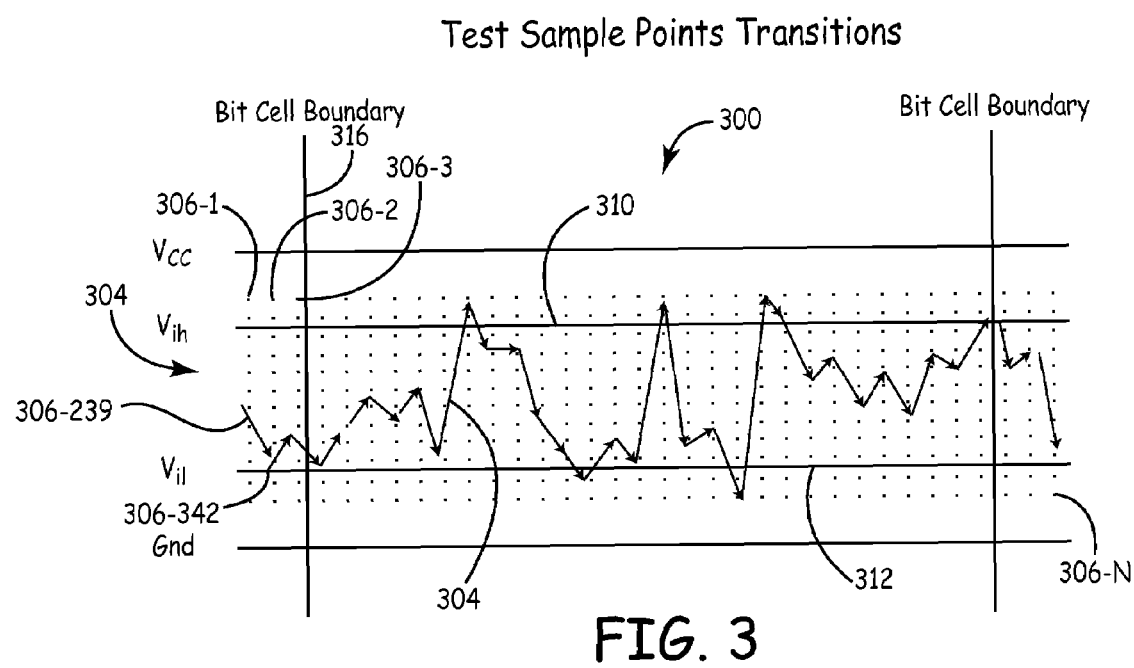
FIG. 3 is a logic voltage level graph with a test waveform.

Referring to FIG. 3, an example of a logic level graph 300 with a grid 302 and a waveform 304 using the grid 302 of test sample points 306-1 through 306-N is illustrated. This illustrates how the waveform 304 is formed from one test sample point to the next sample point in the grid 302. For example, the first leg of the waveform 304 is formed between test sample points 306-239 and 306-342. As illustrated in this embodiment, some test sample points are located above the $V_{IH}$ voltage level 310 and some test sample points are located below the $V_{IL}$ voltage level 312. This allows for different shaped waveforms 304 that can extend beyond and back into the indeterminate logic area. Moreover, this embodiment also illustrates that the waveforms can be started before the bit cell boundary 316, which allows for the set up of initial conditions.

Figure 4:
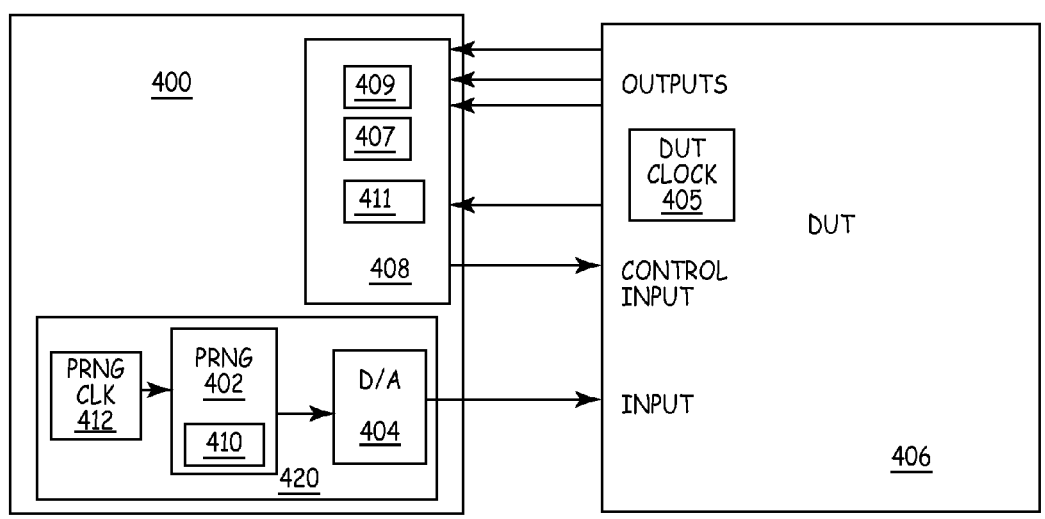
FIG. 4 is a block diagram of a test system of one embodiment.

To complete a test, pseudo random waveforms are applied to the logic circuit (or DUT) being tested. An example of a test system 400 is illustrated in FIG. 4. Test system 400 includes a pseudo waveform generator 420. In this embodiment, the pseudo waveform generator includes a clock 412, a pseudo random number generator (PRNG) 402 and a digital to analog (D/A) converter 404. As illustrated, an output of the PRNG 402 is coupled to the D/A converter 404. An output of the D/A converter 404 is coupled to an input of a DUT 406. In one embodiment, the D/A converter 404 is a multi-bit D/A converter. In this embodiment, a plurality of sequentially contiguous bits from the PRNG 402 are passed through the multi-bit D/A converter 404 to the input of the DUT. In one embodiment the D/A converter 404 is a R-2R resister ladder. In another embodiment, the D/A converter 404 is a low pass filter. In this embodiment, a low pass filter (such as a capacitor—resistor low pass filter) performs a rudimentary D/A converter when passing the bits from the PRNG 402 (which is used as a pulse width modulated signal) to the input of the DUT 406. Moreover, in one embodiment, the low pass filter is merely the intrinsic characteristics on the input port of the DUT 406. Further yet in another embodiment, the D/A converter 404 is a combination of a multi-bit D/A converter and a low pass filter. This embodiment, provides additional levels of precision.

As illustrated, a plurality of redundant outputs of the DUT 406 are coupled to an output tester 408. The output tester 408 is adapted to determine the fault coverage of the DUT 406 by observing the outputs of the DUT 406 in response to the pseudo random waveforms applied to the input of the DUT 406. In particular, in this embodiment, the output tester 408 includes control circuitry 409 that is adapted to observe the plurality of outputs, compare the outputs and store statistics regarding counts of matching, non-matching, and indeterminate outputs for each pseudo random waveform applied to the input of the DUT 406 in memory 407. Moreover, control circuitry 409 is further adapted to determine the fault coverage of the DUT by comparing the stored counts of match the non-matched and indeterminate data in the memory 407 upon completion of a test. The outputs of the DUT 406 need not be bit by bit identical. For example, some of the outputs could be designed to be inverts of the other outputs. The output tester 408, in embodiments of the present invention, are adapted to take this into consideration in determining matching and non-matching data. In addition, the control circuitry 409 is adapted to control functions of the DUT 406 through an optional set of control inputs, for those DUTs which may need them. These controls include such things as output enables, resets, voltage operating levels, operating frequencies levels and the like. This allows the testing of the DUT under different conditions.

As stated above, to ensure coverage, the test waveforms must cover every test sample point in a grid and every possible sequential combination of test sample points in the grid. In one embodiment, the PRNG 402 accomplishes this with at least one linear feedback shift register (LFSR) 410 using primitive polynomials as the feedback. As illustrated in FIG. 4, the LFSR 410 is driven by a clock signal from clock 412.

By using a linear feedback shift register 410 with primitive polynomials as the feedback, it is guaranteed that all test sample points will occur and all sequential combinations will occur up to the size of the shift register. Examples of shift register sequences can be found in Golumb's, *Shift Register Sequences*, published by Aegean Park Press, 1982.

The amplitude grid spacing is determined by the length of the contiguous bit sequences extracted from LFSR 410 and sent to the D/A converter and the relation of bit width to the time constant of the low pass filter. To eliminate amplitude correlations from one time step to the next, the extracted LFSR bit sequences should not overlap. The longer the LFSR 410, the longer the unique and uncorrelated sequence of test points that can be created. However, the more test points, the longer it will take to complete the test. Therefore, there is a trade off between the length in time the testing requires and the thoroughness of the test. To provide a better understanding of the present invention, a grid example requiring 16 levels in amplitude is herein provided. In this example, four bits are taken out of the LFSR 410 at a time. Accordingly, in this embodiment, the LFSR 410 is clocked 4 times faster than the DUT is run. For example, the LFSR clock 412 may be running at 1 Giga Hertz while the DUT runs at 250 Mega Hertz.

In another embodiment of the present invention, the PRNG 402 includes four similar LFSRs 410. In this embodiment, each of the LFSRs 410 uses the same feedback polynomial and are started ¼ of the way through the sequence (i.e. the LFSRs are staggered). The outputs of the four LFSRs 410 of this embodiment are then fed into the D/A converter 404 which in turn provides the inputs for the DUT 406. The advantage of this embodiment is that the LFSRs can be run at the same clock rate as the DUT. In one embodiment, for each digital to analog input bit, a bit from each of the LFSR's are XOR'ed together.

Although, the D/A 404, the output tester circuit 408 and clock 412 are illustrated as being internal to the tester 400 in FIG. 4, other examples have these devices external to the tester 400. For example, in other embodiments, a clock signal that operates the one or more LFSRs 410, are supplied externally to the respective devices. Likewise, in other embodiments the D/A 404 and/or the output tester 408 are external to the tester 400. In one embodiment, a clock 411 used to sample the DUT's outputs is coordinated with a clock 405 of the DUT such that the DUT's outputs are not sampled at the points in time when the DUT is changing them.

Figure 5:
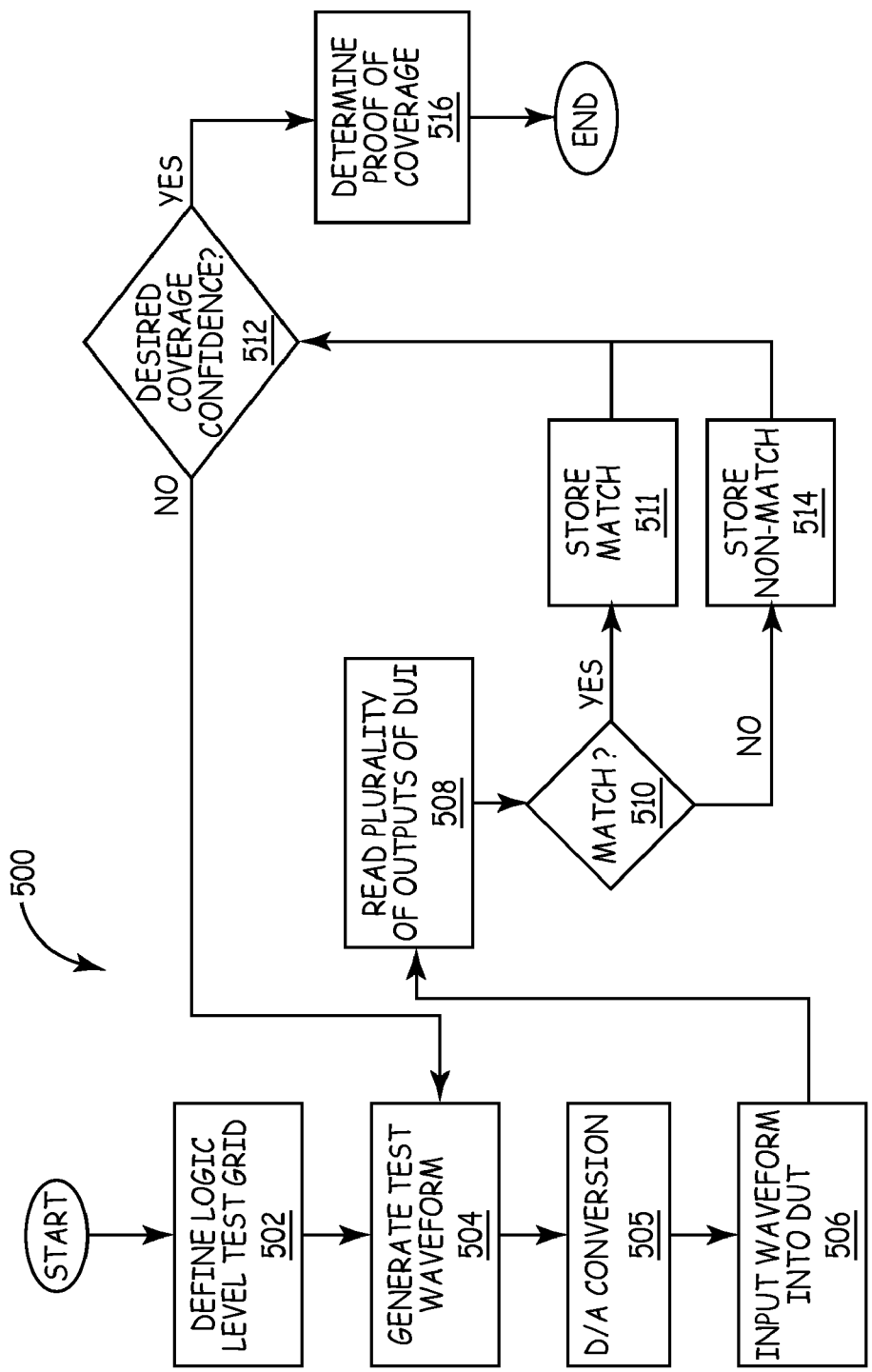
FIG. 5 is a flow chart illustrating one method of one embodiment.

Referring to FIG. 5, a flow chart 500 illustrating one method of proof verification of the present invention is illustrated. As illustrated, in this embodiment, the method is started by first defining a logic level test grid (502). As discussed above, the logic level test grid sets out test sample points to be tested. A waveform is then generated that covers select test points in the logic level test grid (504). Embodiments of the present invention use a pseudo random waveform generator to generate the waveforms. In particular, in one embodiment, digital signals (from one or more linear feedback shift registers) are converted to an analog signal (505) to form the waveform. Each waveform is then inputted into an input of a DUT (506). A plurality of redundant outputs of the DUT are then observed in response to the input (508). The outputs are compared with each other to determine if they all match (510). If all the outputs match (510), data regarding match count statistics is stored in a memory (511). If all the outputs in response to an input do not match (510), data regarding non-match count statistics is stored in a memory (514).

It is then determined if all the possible test sample points and sequential combinations of test sample points in the logic test grid have been covered (512). In one embodiment, determining if all test sample points and sequential combinations of test sample points have been covered is done by tracking the number of signals the pseudo random number generator has produced and comparing the number with a predetermined number that generally guarantees that every possible test sample point and every possible sequential test sample points over a time period has occurred. In another embodiment, the value of the LFSR's internal state is examined. If the state is the same as the original state and a primitive feedback polynomial is used, the LFSR has gone through all possible internal states. In one embodiment, once an end of the test waveforms is determined, an end-of-test processing is performed. The determination of the number of waveforms to apply is determined by the length of the LFSR in use which in turn is related the number of test sample points in the test grid. In this embodiment, you determine the number of waveforms to apply by multiplying the number of test sample points in a vertical column by the number of test sample points in the next sequential vertical column and so on. For example, if you have 14 test sample points in a horizontal row and there are 16 test sample points in each vertical column, the number of waveforms to apply to the DUT in this example is determined by the equation $16^{14}$.

Referring back to FIG. 5, if all the test points and combinations have not been covered (512), the process continues at step 504 by generating another waveform (504). Once it has been determined that all the test points and combinations have been covered at step 512, the proof of coverage of the DUT is calculated and displayed (516). In one embodiment, this is done by observing the statistics of match, un-match and indeterminate data in the memory and then comparing the total amount of the matches with the total number of non-matches and indeterminants reported.

Figure 6:
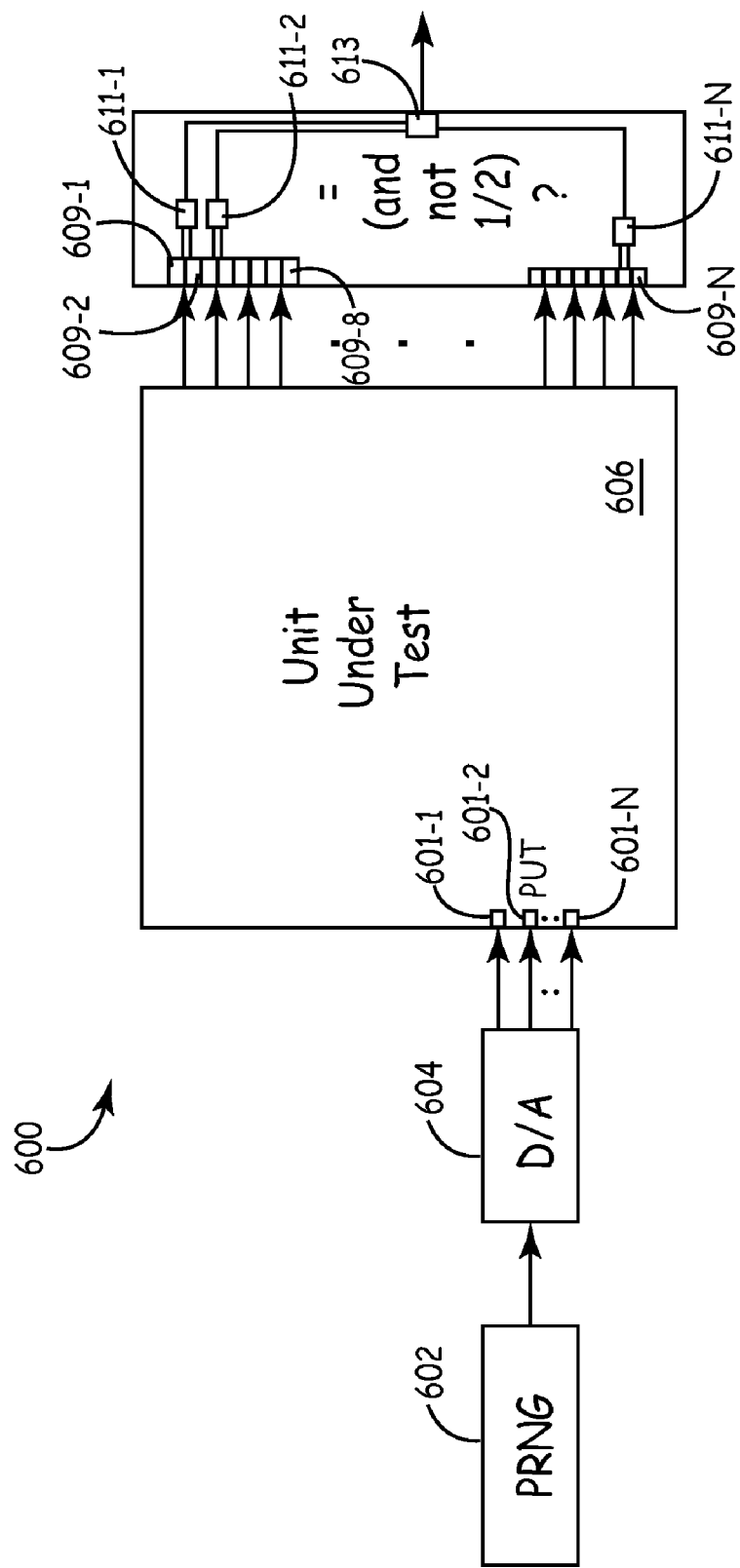
FIG. 6 is a block diagram of a testing system of another embodiment.

FIG. 6 illustrates a test system 600 of another embodiment of the present invention. As illustrated, the test system includes a pseudo random number generator 602, a digital to analog converter 604 and an output tester circuit 608. The pseudo random number generator 602 is adapted to generate pseudo random waveforms. The digital to analog converter is adapted to convert the digital pseudo random waveform into analog signals. The converted pseudo random waveforms are applied to at least one input of a DUT 606. In this embodiment, the DUT has multiple inputs 601 (1-N) that can be tested simultaneously. In this multiple input embodiment, the waveforms are guaranteed not to be correlated or to have some fixed known correlation as required by the DUT. The outputs of the DUT are coupled to the output tester circuit 608. The output tester circuit 608 is adapted to output a result of the comparisons of the outputs of the DUT. A verified output of the output test circuit 608 will occur when all of the outputs match and the matched outputs are not in the ½ logic (or indeterminate logic) range. In one embodiment, the output test circuit 608 includes a plurality of flip flops 601 (1-N). In one embodiment, two flip flops are coupled to each output of the DUT 606. If after taking samples close together of an output of the DUT by two associated flip flops 609, the flip flops produce different values once they settle down, the logic level is determined to be in the indeterminate range and a verified output signal from the output test circuit 608 will not occur. In one embodiment, this is done with flip flop comparators 611 (1-N). Moreover, in one embodiment, all of the flip flops 609 (1-N) must agree for a verified output signal to be produced by the output test circuit 608. In one embodiment, this is done with an overall comparator 613. However, in an embodiment where the DUT 606 produces outputs with inverts, the output test circuit is adapted accordingly. For example, the test circuit 608 can be adapted to invert the inverts before or after they are applied to the flip flops.

Figure 7:
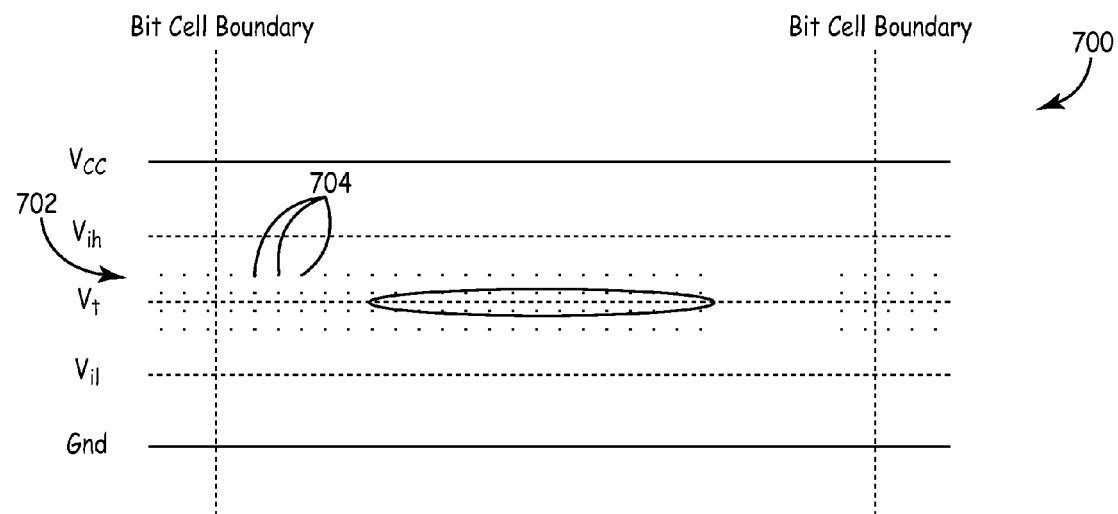
FIG. 7 is a logic voltage level graph with a grid of reduced test sample points of one embodiment of the present invention.

As discussed above, embodiments of the present application reduce the range of voltages that have to be tested by determining the threshold of the DUT. This is illustrated in FIG. 7. In particular, FIG. 7 is a logic level graph 700 with a logic level test grid 702. Comparing this test grid 702 with the test grid 202 of FIG. 2 it becomes apparent that the number of test points 704 in regards to FIG. 7 is significantly less that the test points 204 in the test grid 202 of FIG. 2. Hence, knowing the threshold of the DUT reduces the number of test points 704 that have to be tested allows for a more efficient proof of coverage testing method. Also illustrated in FIG. 7 is an area of variance 706 in which one would expect to find the switching threshold (both in voltage amplitude and time) over multiple physical copies of the DUT. Sample points outside the area of variance 706 are used to ensure that the results of the tests are conservative and (for test points left of the area 706) to set up voltages and currents within the DUT which may dynamically effect the switching threshold.

Figure 8A:
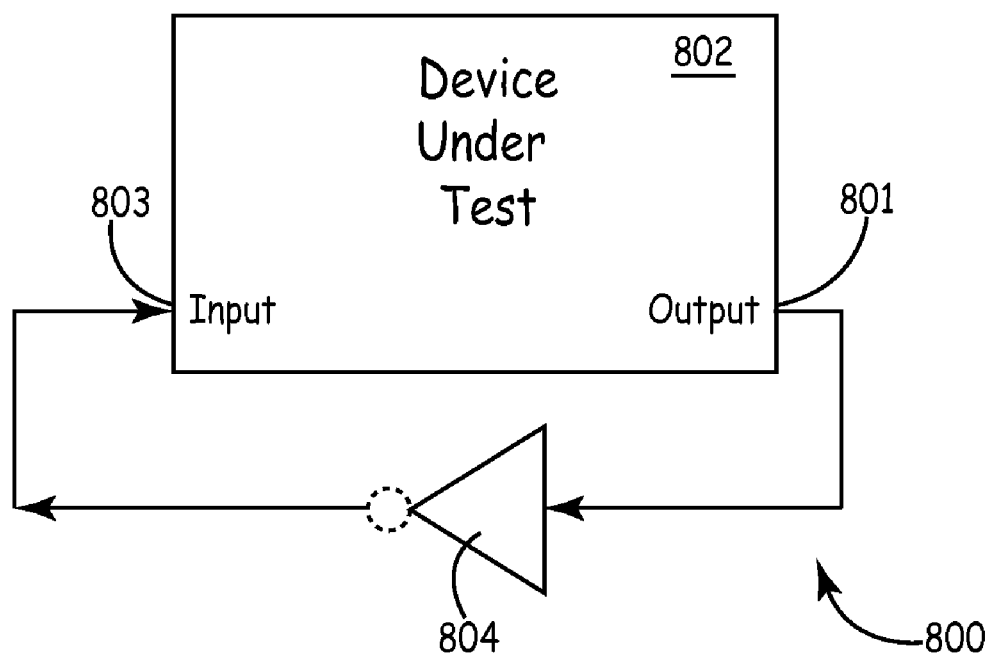
FIG. 8A through 8C are block diagrams illustrating various embodiments of a threshold determining systems of the present invention.
Figure 8B:
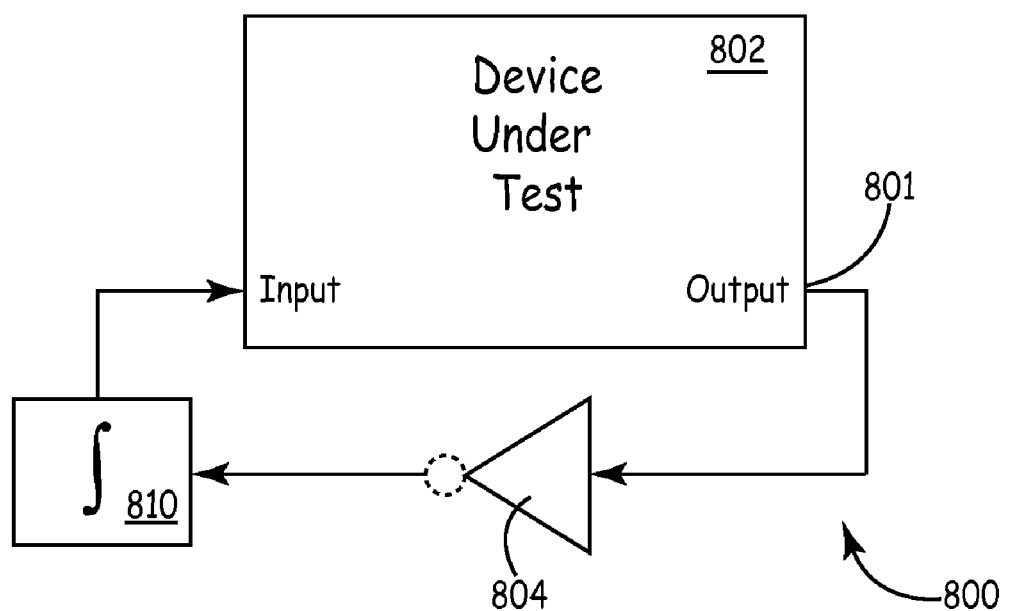

FIGS. 8A and 8B illustrates one embodiment of a threshold determining device 800. As illustrated in FIG. 8A, and output 801 of the DUT 802 is connected back (looped back) into an input 803 of the DUT 802. In this embodiment, a buffer or inverter 804 is included in the loop (or feedback loop) to create an odd number of inversions back to the input 803. If the DUT 802 produces an output 801 that is inverted from its input data 803, a buffer is used; otherwise, an inverter is used. This ensures that the totality of the loop contains an odd number of inversions. This creates oscillations. Referring to FIG. 8B, an integrator 810 is further included in the loop. The integrator has a relatively large time constant to filter out the oscillations. The integrator's 810 output will eventually settle on a value that will be the input threshold voltage of the DUT 802.

Figure 8C:
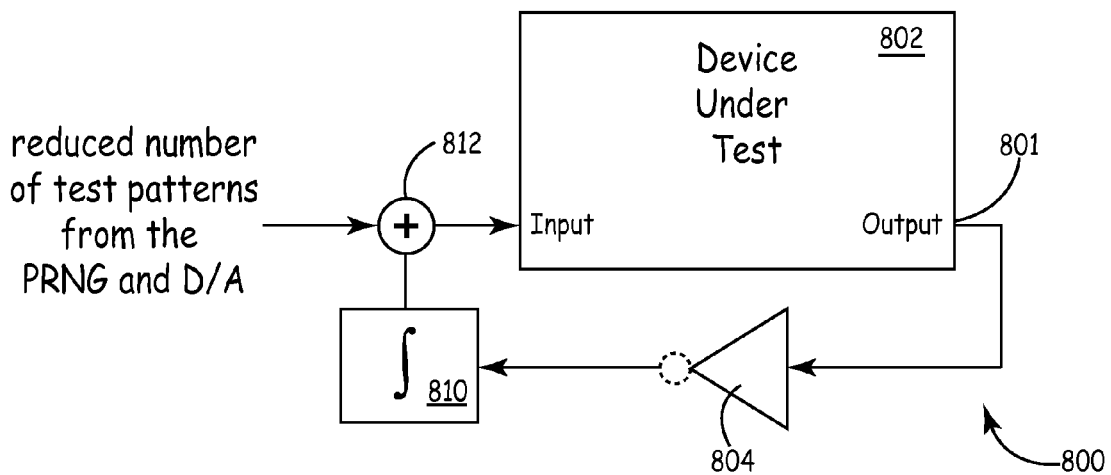

Completion of a tester with the threshold determining device 800 of one embodiment is illustrated in FIG. 8C. As illustrated, an adder 812 adds the pseudo-exhaustive bit pattern trajectories with the reduced number of amplitude test points 704 from the PRNG 402 and D/A converter 404 with the input feedback from the integrator 810. In one embodiment, the test patterns are DC balanced over the time constant of the integrator. In another embodiment, the output of the integrator 810 is held constant (latched) during that time that the pseudo exhaustive bit pattern trajectories are applied.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

The invention claimed is:

1. A method of determining a device threshold voltage, the method comprising:
   connecting a feedback loop between at least one output of the device and at least one input of the device, the loop including a select number of inverters wherein the at least one output is inverted from the at least one input to create oscillations; and
   filtering out the oscillations wherein the at least one output settles on a threshold value of the device.

2. The method of claim 1, comprising:
   coupling a buffer in the feedback loop.

3. The method of claim 1, wherein filtering the oscillations further comprises:

using an integrator with a very large time constant to filter out the oscillations.

4. The method of claim 1, farther comprising:

reading an output after the oscillations have been filtered out.

5. A method of providing proof coverage of a Byzantine fault tolerance logic circuit, the method comprising:

determining an input threshold voltage of a device under test;

defining a logic test grid of test sample points based at least in part on the input threshold voltage of the device under test;

generating pseudo random test waveforms configured to cover the test sample points; and observing the output of the device under test.

6. The method of claim 5, wherein determining the input threshold voltage of the device under test further comprises:

connecting an output of the device under test to an input of the device under test, wherein a select number of inverters are connected between the output and the input wherein the output is inverted from the input and an oscillator is formed with the device under test; and using an integrator between the connection with a very large time constant to filter out the oscillations, wherein an output of the integrator will settle on the input threshold value.

7. The method of claim 6, further comprising:

latching the output of the integrator to a constant value before applying the pseudo random test waveforms.

8. The method of claim 6, further comprising:

DC balancing the pseudo random test waveforms over the time constant of the integrator.

9. A device input threshold tester, the tester comprising:

a feedback loop coupled between an output of a device under test and at least one input of the device under test, the feedback loop including a select number of inverters wherein the output is inverted from the input to create oscillations; and an integrator with a very large time constant adapted to filter out the oscillations wherein the output settles on a threshold value of the device under test.

10. The tester of claim 9, wherein the feedback loop further includes:

an inverter.

11. The tester of claim 9, wherein the feedback loop further includes:

a buffer.

12. A Byzantine filter tester, the tester comprising:

a feedback loop coupled between an output of a device under test and an input of the device under test, the feedback loop including a select number of inverters wherein the output is inverted from the input to create oscillations, the feedback loop further including an integrator with a very large time constant to filter the oscillations to determine the input threshold of the device under test;

a pseudo random waveform generator adapted to couple waveforms to the input of the device under test that are configured to cover test points in a logic grid defined in part by the determined input threshold of the device under test; and an output tester adapted to observe a plurality of redundant outputs of the device under test to verify the proof coverage of the device under test.

13. The Byzantine filter tester of claim 12, further comprising:

an adder to add an output of the integrator with the waveforms from the pseudo random waveform generator.

14. The Byzantine filter tester of claim 12, wherein the feedback loop further comprises:

an inverter.

15. The Byzantine filter tester of claim 12, wherein the feedback loop further comprises:

a buffer.

16. A Byzantine filter tester comprising;

a means to determine an input threshold of a device under test;

a means to create a logic grid of test points based at least in part on the threshold of the device under test;

a means to provide pseudo random test waveforms to an input of the device under test that are configured to cover the test points in the logic grid; and a means to monitor an output of the device under test in response to the pseudo random test waveforms.

17. The Byzantine filter tester of claim 16, wherein the means to determine the input threshold further comprises:

a means to create an odd number of inversion from an output of the device under test to create and oscillation; and a mean to filter the oscillation to determine the input threshold.

* * * * *